United States Patent [19]

Ashley et al.

[11] Patent Number: 4,801,861
[45] Date of Patent: Jan. 31, 1989

[54] APPARATUS FOR MEASURING FREQUENCY MODULATION NOISE SIGNALS HAVING A FREQUENCY RESPONSE COMPENSATION CIRCUIT

[75] Inventors: James R. Ashley, Nashua, N.H.; Frank M. Palka, Safety Harbor, Fla.

[73] Assignee: Hercules Defense Electronics Systems Inc., Clearwater, Fla.

[21] Appl. No.: 90,316

[22] Filed: Aug. 28, 1987

[51] Int. Cl.$^4$ .................... G01R 23/00; G01R 23/16; G01R 27/00
[52] U.S. Cl. .............................. 324/57 N; 324/58 B; 324/77 E; 328/162; 328/167
[58] Field of Search ................ 324/57 R, 57 N, 58 B, 324/77 A, 77 B, 77 E, 77 F, 78 F, 95; 328/162, 167

[56] References Cited

U.S. PATENT DOCUMENTS

| | | | |
|---|---|---|---|
| 3,675,124 | 7/1972 | Ashley et al. | 324/57 N |
| 4,429,309 | 1/1984 | Kipp | 328/167 X |
| 4,549,312 | 10/1985 | Michaels et al. | 328/167 X |
| 4,634,962 | 1/1987 | Banura et al. | 324/57 N |
| 4,721,870 | 1/1988 | Rector et al. | 328/167 X |

OTHER PUBLICATIONS

Chasek, Norman, "Avalanche Diodes Permit in Service Measurements . . . in Microwave Equipment", Electronics, Jan. 19, 1970 pp. 87–91.

Primary Examiner—Gerard R. Strecker
Attorney, Agent, or Firm—Seymour Levine; Michael B. Keehan; Edmund C. Ross, Jr.

[57] ABSTRACT

A microwave bridge circuit for measuring frequency modulation noise signals arising in low power, high frequency sources having a highly non-constant FM noise versus baseband frequency characteristic includes amplifying and filtering means for excluding signals in frequency ranges beyond the field of interest and frequency response compensator means of attenuating signals outside the primary range of interest.

10 Claims, 4 Drawing Sheets

APPARATUS FOR MEASURING FREQUENCY MODULATION NOISE SIGNALS HAVING A FREQUENCY RESPONSE COMPENSATION CIRCUIT

BACKGROUND OF THE INVENTION

1. Field of the Invention

The present invention pertains to improved means for the measurement of noise characteristics of oscillators and more particularly to means for the measurement of frequency modulation noise on the carrier output of low-power microwave signal sources such as those employing a crystal oscillator and a frequency multiplier.

2. Description of the Prior Art

Means for the measurement of noise signals generated in high frequency oscillators are known in the art. Systems are known, for instance, that employ high frequency discriminators wherein the noise measurement threshold is determined by noise internally generated within crystal diode detectors in a discriminator device. Such systems, however, provide a limited output power so that measurement of the frequency modulation noise characteristics is not practical for evaluating such sources as high frequency crystal oscillator or semiconductor signal sources.

U.S. Pat. No. 3,675,124 issued in the names of the present inventors and assigned to the present assignee, concerns a system for the measurement of the frequency modulation noise on carrier signals from low power, high frequency sources such as cavity stabilized semiconductor diode oscillators. An auxiliary injection phase locked oscillator driven by the oscillator to be tested, provides an output signal in which the noise spectrum of the oscillator to be tested is reproduced at an amplitude sufficient to drive a frequency discriminator at a level permitting noise measurement. Modulation characteristics of crystal oscillators and frequency multiplier signal sources, however, produce FM noise which may overload this system.

Although the aforementioned noise measurement systems have proven useful in most instances, they are of limited value when measurements on certain state-of-the-art frequency synthesizer sources are required. The problem becomes particularly acute when measuring the FM noise of a microwave signal source which is phase synchronized to a multiple of high frequency or very high frequency crystal controlled oscillator wherein noise frequency deviation is small in the low baseband region but rises rapidly as the baseband region increases. The deviation in the higher baseband region may overdrive the wave analyzer and mask the frequency deviation which is the subject of the measurement. The present invention is directed principally to overcoming this problem.

SUMMARY OF THE INVENTION

The measurement of FM noise generated in some microwave signal sources such as those employing a crystal controlled oscillator display a noise versus baseband frequency characteristic that is low and substantially linear throughout a low baseband frequency range but rises rapidly at a substantially constant rate with increasingly higher baseband frequencies. In order to accommodate the resulting wide range of noise levels, the circuit of the present invention includes response compensation means for avoiding overloading the measuring circuits with high frequency baseband signals and amplifier/filter means for accentuating the sensitivity of the measuring circuits at the low baseband frequencies.

DESCRIPTION OF THE PREFERRED EMBODIMENTS

Figure 1:
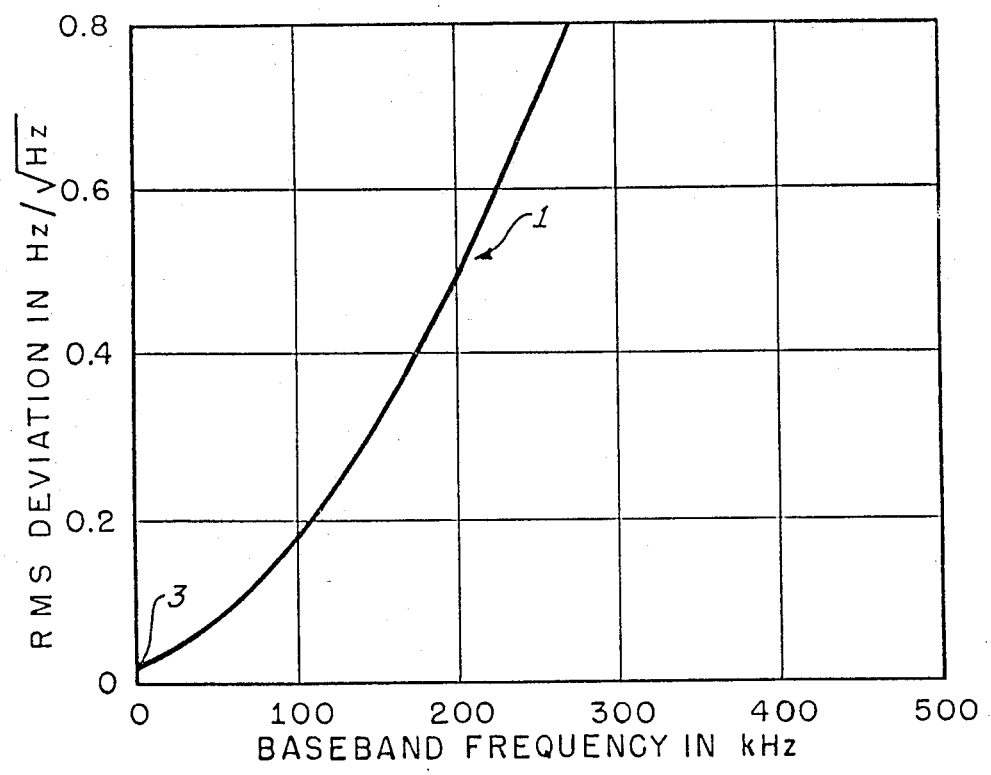
FIG. 1 is a graph illustrating the FM noise characteristics of the microwave signal source of the type under consideration.

FIG. 1 illustrates the FM noise characteristics generated in a typical X-band microwave signal source employing a crystal oscillator and frequency multiplier. As can be seen in FIG. 1, the noise characteristic 1 displays a relatively flat plateau 3 throughout the lowest baseband frequency region but increases substantially with increasing baseband frequencies. In the higher baseband frequency regions, the FM noise characteristics increases essentially linearly.

In some applications the plateau region of the FM noise characteristic is of prime importance. Where the microwave signal source is to be used in a Doppler radar installation, for example, the FM noise in a region from about 10 Hz to 100 KHz is the controlling factor in system performance. The noise level in the low level plateau area must be accurately measured despite the relatively large deviation above 100 KHz. This large deviation overloads the input stages of the measuring apparatus, thus causing the relatively small deviation in the plateau region of interest to fall below the internal noise threshold of the measuring apparatus.

Figure 2:
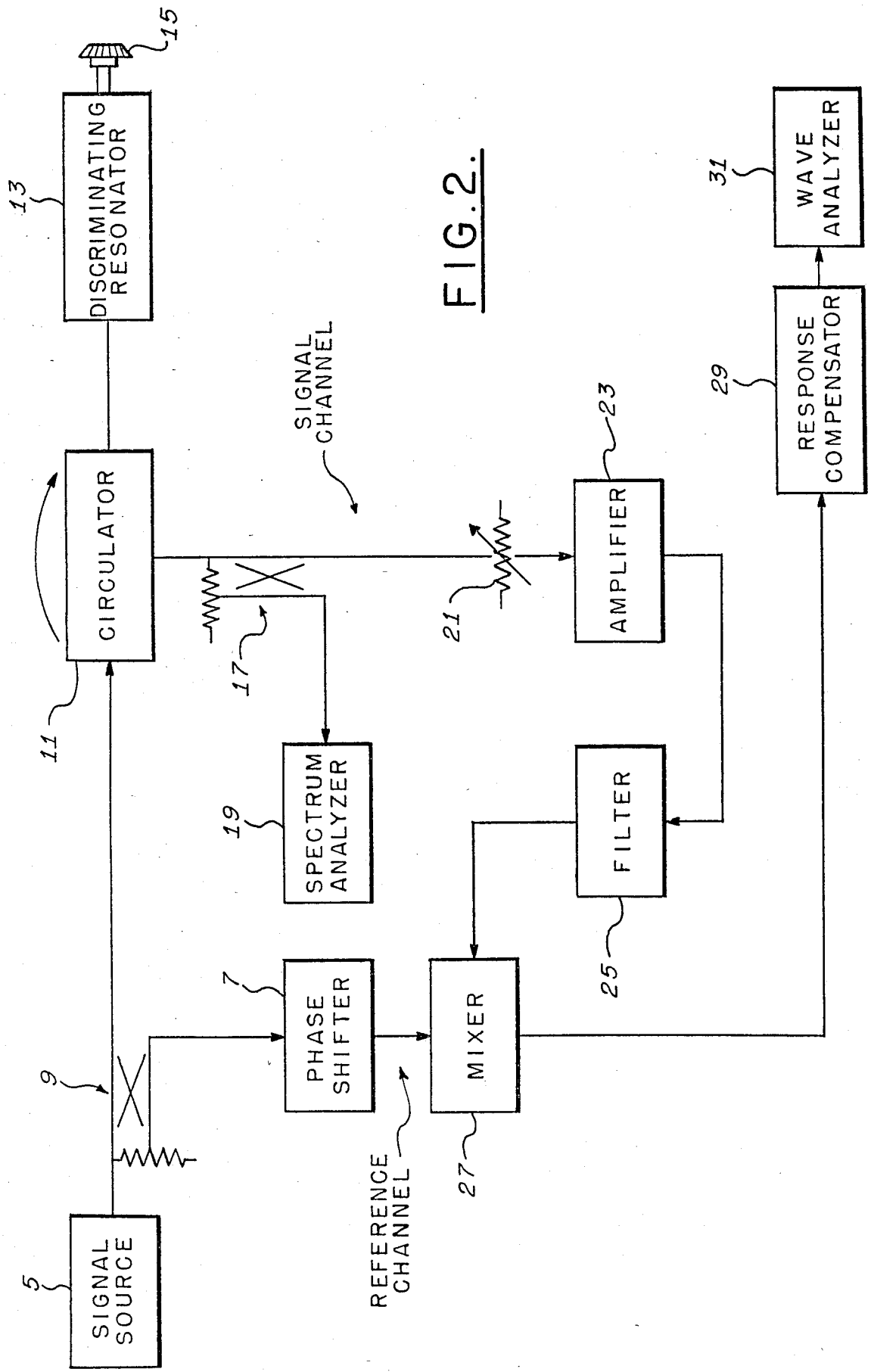
FIG. 2 is a block diagram illustrating a typical circuit employing the principles of the invention.

The FM noise measuring apparatus of the present invention is illustrated in block form in FIG. 2.

As was the case of the noise measuring apparatus described in the aforementioned U.S. Pat. No. 3,675,124, the present invention employs a microwave bridge circuit containing a reference channel and a signal channel. The signal source under test 5 is coupled to a phase shifter 7 in the reference channel through a directional coupler 9 which typically provides 6–10 db attenuation.

The phase shifter is adjusted during calibration so as to compensate for the phase difference arising from unequal transmission line lengths in the reference and signal channels. The source signal is also applied through a three port circulator 11 to a discriminating resonator 13, which may be of the tunable cavity resonator type. The discriminating resonator 13 is a high Q resonant cavity having conventional means for providing adjustable coupling to circulator 11 and being tunable over a given frequency range by virtue of adjusting means 15.

Signals from the resonator 13 are passed through the circulator 11 into the signal channel. A portion of the signal in the signal channel passes through a coupler 17 to a conventional spectrum analyzer 19 which is used in tuning the discriminator cavity resonator 13 in accordance with known techniques. Typically, the coupler 17 provides a signal to the spectrum analyzer 19 that is 20 dB below the signal coupled from the circulator 11. The major portion of the signal in the signal channel is passed through an adjustable attenuator 21 to a signal frequency low noise amplifier 23. The output signal from the amplifier 23 is applied through a known type of narrowband cavity filter 25 to a balanced mixer 27 where it is combined with the reference signal from the phase shifter 7.

The balanced mixer 27 acts as a phase sensitive detector and may be any one of a variety of commercially available single or double balanced mixers. Typical of these devices are those known as the orthomode and orthotee balanced mixers.

The difference frequency output signal from the balanced mixer 27 is applied to a response compensator circuit 29, yet to be described, the output signal of which is evaluated in a conventional wave or spectrum analyzer 31. This wave analyzer may be a commercially available tunable voltmeter having accurately calibrated selectable frequency band such as, for example, a Hewlett Packard HP3585. These devices permit noise voltage measurements over a predetermined band of frequencies with known noise bandwidth.

As previously stated, the particular problem addressed by the present invention is the measurement of FM noise on the carrier signal output of a low power microwave signal source of the type employing a fundamental crystal oscillator and frequency multipliers. This is accomplished in the present invention by modifying the prior art apparatus of U.S. Pat. No. 3,675,124 with the addition of the signal frequency amplifier 23, the filter 25 and the response compensation circuit 29.

Figure 3:
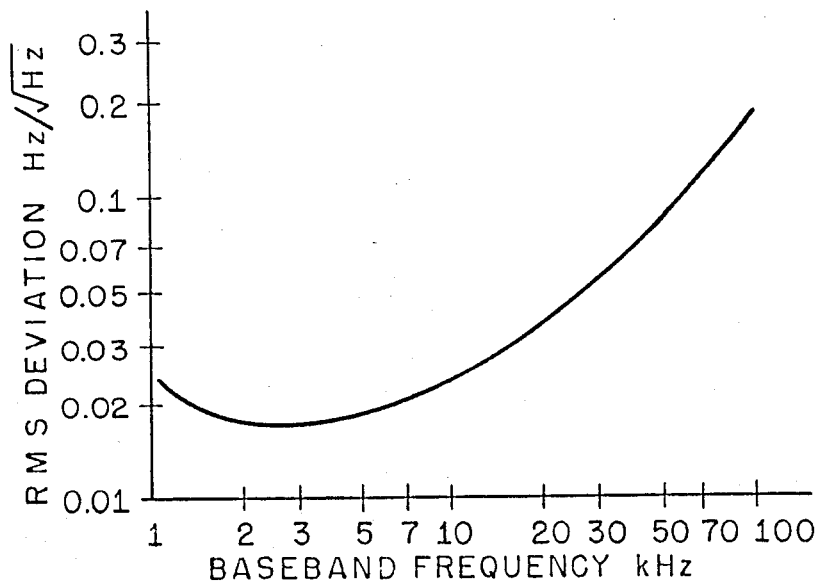
FIGS. 3 and 4 are graphs useful in explaining the operation of the apparatus of FIG. 2.

To better understand the nature of these improvements, refer now to FIG. 3 which is a logarithmic plot of noise versus lower baseband frequency produced by a typical microwave signal source employing a VHF crystal oscillator. This graph presents the plateau and lower baseband regions of FIG. 1 with an expanded baseband frequency scale. These regions, it will be recalled, are of interest in such applications as Doppler radar microwave sources.

It will be noticed that the characteristic displayed in FIG. 3 is relatively flat in the plateau regions below about 10 KHz, but beyond this region, the characteristic has a slope of approximately +1. It should be noted that this would correspond to a slope of 20 dB per decade in a Bode plot. In accordance with the principles of the invention, this positive slope is effectively cancelled by passing the balanced mixer signal through the response compensator 29 which provides a normalized slope of −1 in the higher frequency regions. Such a characteristic can be provided by a Butterworth filter, for example.

Figure 4:
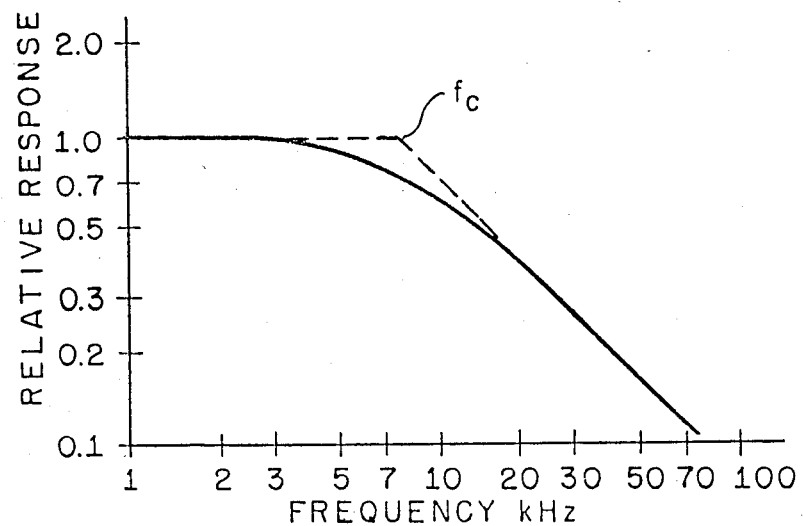

The filter reaponse required in the compensator circuit is depicted in FIG. 4. It should be apparent that the filter response characteristic is essentially the inverse of the modulation noise characteristic of the oscillator under test in that it consists of a horizontal portion corresponding to the plateau region of the source under test and a portion having a −1 normalized slope beyond a "corner" frequency $f_C$. Typically $f_C$ occurs where the needed compensation is down 3 dB.

Figure 5:
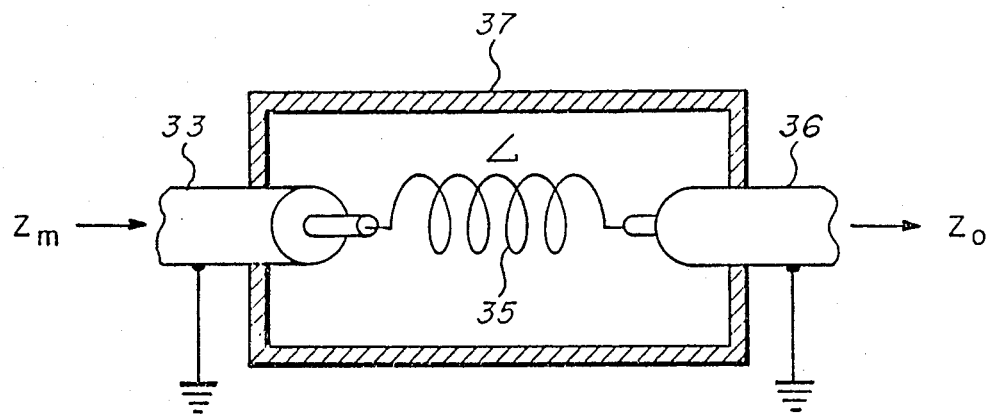
FIGS. 5 and 6 depict specific response compensator circuits used in practicing the invention.

The response compensation circuit may comprise a passive filter as portrayed in FIG. 5, wherein the input signal from the balanced mixer 27 is applied through a coaxial cable 33 to an inductor 35 having inductance L and the output is applied to the wave analyzer 31 through a coaxial cable 36. The inductor is enclosed within a magnetic shield 37.

The value of the inductor 35 may be calculated in accordance with the known formula:

$$L = \frac{Z_O + |Z_M|}{2\pi f_C}$$

where $Z_O$ is the input impedance of the wave analyzer, $Z_M$ is the output impedance of the balanced mixer, and $f_C$ is the desired corner frequency.

It is desirable to minimize the length of the coaxial cable 33 intercoupling the mixer 27 and the response compensator. If feasible, the inductor 35 could be actually installed in the mixer itself.

Figure 6:
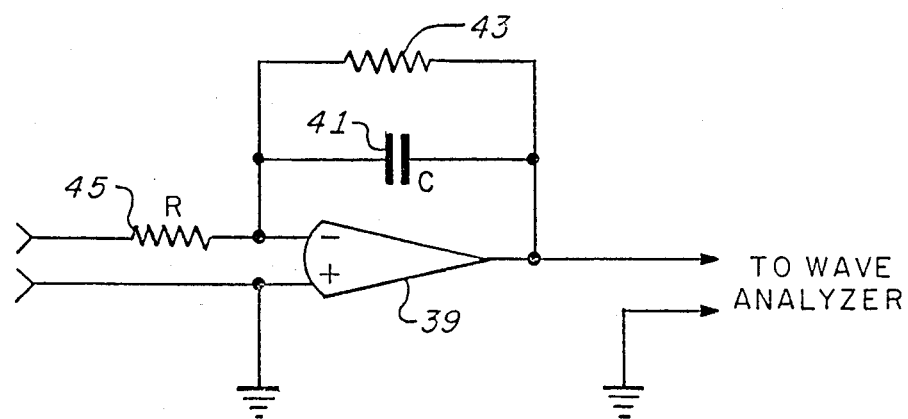

Although the passive filter of FIG. 5 is presently preferred as the response compensator, alternative forms of compensators may be used where desired. The shaping of the relative response versus frequency characteristic of FIG. 4, for instance, may be obtained by using an operational amplifier in a negative voltage feedback arrangement as depicted in FIG. 6. In this version of the compensator, an operational amplifier 39 is fitted with an RC feedback loop connected between the amplifier's output and negative input terminals. The RC feedback loop contains a capacitor 41 shunted by a resistor 43. An input resistor 45 is selected to match the output impedance of the mixer. A resistor typically having ten times the resistance of the input resistor is selected as the feedback resistor 43. The capacitance 41 is determined by means of the relationship:

$$C = 1/20\pi f_C r$$

where again, $f_C$ is the corner frequency as depicted in FIG. 4.

Referring again to FIG. 2, the signal frequency amplifier 23 and the filter 25 are used to provide a signal suitable for driving the balanced mixer 27. The crystals in a typical balanced mixer provide an unwanted noise signal that sets the threshold below which measurements cannot be made. This is particularly crucial when measurements in the plateau region 3 of FIG. 1 are attempted.

The signal frequency amplifier may be a straightforward solid state device, which in the microwave region, typically has a noise figure some 5 dB better than that of a comparable balanced mixer. Such an amplifier, however, has a relatively wide bandwidth so that effectively integrating the noise over that band would yield sufficient power to overload the balanced mixer. In order to prevent this from happening, the output of the amplifier is applied through the narrowband filter 25 to the balanced mixer. This narrowband filter limits the signals reaching the mixer to signals within the frequency band of interest.

The narrowband filter also improves the sensitivity of the discriminator. Like the resonator of discriminator 13, the narrow band filter 25 has steep phase shift versus frequency characteristics. Preferably, the filter and discriminator should have the same physical dimensions and operate in the same mode. Under these conditions, the slope of the voltage versus frequency characteristic will be doubled and provide an additional 6 dB improvement in the threshold level.

Before conducting actual tests, the circuit of the invention is calibrated in accordance with known techniques which are fully described, for example, in the aforementioned U.S. Pat. No. 3,675,124.

In brief, during calibration, the discriminator cavity 13 is tuned to the input signal frequency as indicated by the spectrum analyzer 19, the voltage input level to the microwave bridge is adjusted to an acceptable level, the wave analyzer 31 is tuned to the modulation frequency, and the phase shifter 7 is adjusted to compensate for phase differences in the two channels, and the filter 25 and phase shifter 7 are tuned for a maximum indication on the wave analyzer 31.

By applying an input signal of known frequency deviation, $\Delta f$, and noting the resulting voltage deviation, $\Delta v$, on the wave analyzer, the discriminator characteristic slope $\Delta f/\Delta v$ can be calculated. This value is used as a calibration factor.

The calibration techniques must be extended to account for the frequency response of the response compensator 29 and possibly a response modification by narrowband filter 25. This can be done with these steps.

1. Frequency modulate the signal under test or a substitute signal generator at a modulation frequency $f_m$ to a known deviation f. The modulation frequency is varied in a step wise fashion from about 1/10 of the corner frequency $f_c$.

2. At each modulation frequency, the deviation $\Delta f$ and the resulting discriminator output voltage $\Delta v$, are recorded.

3. A calibration factor table is constructed to give discriminator characteristic slope $\Delta f/\Delta v$ versus modulation frequency.

During actual testing of a microwave signal source, the voltage output of the balanced mixer as modified by the response compensator is measured by wave analyzer 31 in a conventional manner. The result is a table of values of noise voltage as a function of frequency. By multiplying each of these noise values by the calibration factor, a plot of frequency modulation noise as a function of frequency may be obtained.

The calibration factor table just discussed is applied to the measurement process by multiplying the noise values by the appropriate calibration slope from the table. By appropriate interpolation, a noise voltage at a baseband frequency f is corrected by the calibration at the nearest $f_m$. The characteristics change slowly enough that linear interpolation between the values of $f_m$ on the table is adequate.

Although the foregoing description is concerned with signal sources using crystal controlled oscillators, it will be appreciated that the circuit of the invention can be used with other oscillators or signal sources as well.

While the invention has been described in its preferred embodiments, it is to be understood that the words which have been used are words of description rather than of limitation and that changes within the purview of the appended claims may be made without departure from the true scope and spirit of the invention in its broader aspects.

We claim:

1. An apparatus for determining the frequency modulation noise of a signal source comprising:
   a mixer coupled to receive signals from said signal source;
   frequency discriminator means for reflecting signals within a predetermined frequency band about a selected carrier frequency;
   compensation means coupled to receive signals from said mixer and having a noise versus frequency response that is flat to a predetermined cut off frequency and a preselected negative slope thereafter to compensate for frequency modulation noise increases beyond said cut-off frequency and for providing signals representative of said frequency modulation noise;
   a circulator coupled to direct signals from said signal source to said frequency discriminator means and direct signals reflected from said frequency discriminator means to an output port;
   a filter coupled between said output port and said mixer wherein said reflected signals are mixed with signals from said signal source to provide signals at frequencies which are differences between frequencies of signals from said signal source and frequencies of said reflected signals, said filter being tuned to maximize said signals representative of said frequency modulation noise; and
   means coupled to receive signals from said compensation means for indicating levels of said frequency modulation noise.

2. The apparatus of claim 1 further including an amplifier coupled between said circulator and said filter.

3. The apparatus of claim 1 wherein said mixer is coupled to said signal source through a directional coupler.

4. The apparatus of claim 3 further including a directional coupler having a main branch coupled between said output port of said circulator and said filter and an auxiliary branch coupled to a spectrum analyzer.

5. The apparatus of claim 1 wherein said indicating means is a wave analyzer coupled to receive said signals representative of said frequency modulation noise.

6. The apparatus of claim 5 wherein said compensation means includes a shielded inductor coupled between said mixer and said wave analyzer.

7. The apparatus of claim 6 wherein said mixer has an output impedance $Z_O$, said wave analyzer has an input impedance $Z_M$, said filter has a corner frequency f and said inductor has an inductance given by $$L = (Z_O + |Z_M|)/(2\pi f_C).$$

8. The apparatus of claim 5 wherein said compensation means includes an operational amplifier having an inverting terminal coupled to said mixer and an output terminal coupled to said wave analyzer, said operational amplifier constructed for negative feedback, having a parallel RC network coupled between said inverting terminal and said output terminal.

9. The apparatus of claim 8 wherein said operational amplifier includes a resistor R coupled between said inverting terminal and said mixer, and said RC network has a resistor of value 10R and a capacitor of capacitance value determined by $C = 1/(20\pi f_C R)$.

10. The apparatus of claim 1 wherein said frequency discriminator and said filter are cavity type devices with equal modal operation.

* * * * *